United States Patent [19]
Kesler

[11] Patent Number: 6,130,582
[45] Date of Patent: Oct. 10, 2000

[54] AMPLIFIER CIRCUIT INCLUDING COMPENSATION CIRCUITRY FOR CANCELING VARIATIONS IN AN AMPLIFIER FEEDBACK SIGNAL

[75] Inventor: Scott Birk Kesler, Kokomo, Ind.

[73] Assignee: Delco Electronics Corporation, Kokomo, Ind.

[21] Appl. No.: 09/205,314

[22] Filed: Dec. 4, 1998

[51] Int. Cl.[7] ................................... H03F 1/30
[52] U.S. Cl. ........................... 330/290; 330/85; 330/96; 330/97; 330/102
[58] Field of Search ..................... 330/290, 85, 86, 330/96, 97, 102

[56] References Cited

U.S. PATENT DOCUMENTS 4,260,954  4/1981  Crooks ..................................... 330/85

*Primary Examiner*—Michael B Shingleton
*Attorney, Agent, or Firm*—Jimmy L. Funke

[57] ABSTRACT

An amplifier circuit (14') for canceling variations in an amplifier feedback signal includes compensation circuitry (50) defining a replica of the feedback current therethrough. The replicated feedback current is drawn from a circuit node (N1) which directs the feedback signal to a differential pair (Q1, Q2) of the amplifier circuit 14', whereby any biasing effects on the differential pair (Q1, Q2) due to changes in the feedback signal resulting from changes in a gate drive output voltage ($V_{GD}$) of the amplifier circuit (14') are eliminated. Accordingly, the gate drive output voltage ($V_{GD}$) may be used to control an ignition coil (L1) drive transistor (16) whereby any changes in gate drive voltage ($V_{GD}$) will not cause the coil current ($I_L$) to deviate from its target coil current limit value.

9 Claims, 4 Drawing Sheets

AMPLIFIER CIRCUIT INCLUDING COMPENSATION CIRCUITRY FOR CANCELING VARIATIONS IN AN AMPLIFIER FEEDBACK SIGNAL

FIELD OF THE INVENTION

The present invention relates generally to amplifier circuitry, and more specifically to amplifier circuitry operable to cancel variations in a feedback signal.

BACKGROUND OF THE INVENTION

Many modern automotive ignition systems include a control circuit operable to control a power transistor connected to an ignition coil. In such systems, the control circuit is operable to drive the power transistor so as to switch ignition coil current on and off, and to linearly control the magnitude of the coil current after the coil has been charged to the desired current level. Automotive ignition systems of this type typically use a current sensing resistor separate from the control circuit to detect the magnitude of the coil current, and to feed this signal back to the control circuit, wherein the control circuit is responsive to the sense resistor signal to dynamically limit the ignition coil current to a desired "hold" current level.

One example of a known automotive ignition system 10 of the type just described is shown in FIG. 1. System 10 includes a control computer 12, which is typically operable to control and manage the overall operation of an internal combustion engine as well as other vehicle subsystems, that is electrically connected to a control circuit 14. Control computer 12 is responsive to various engine/vehicle operating parameters, as is known in the art, to produce an electronic spark timing (EST) signal and provide this signal to control circuit 14. Control circuit 14 includes an EST input buffer 18 electrically connected to a gate drive control circuit 20, wherein gate drive control circuit 20 is operable to provide a gate drive voltage $V_{GD}$ to a power transistor 16. The power transistor 16 is connected at one end to an automotive ignition coil L1, the opposite end of which is connected to a suitable voltage source B+, and is also connected to a sense resistor $R_{SENSE}$. The common connection between power transistor 16 and $R_{SENSE}$ is connected to an inverting input of an error amplifier 22 having a non-inverting input connected to a voltage reference VREF. The output of the error amplifier 22 is electrically connected to the gate drive control circuit 20.

In operation, the gate drive control circuit 20 is responsive to a rising edge of the EST signal, buffered by EST input buffer 18, to switch the gate drive voltage $V_{GD}$ from a low state to a suitable gate drive voltage as shown by voltage 32 of waveform 30 of FIG. 2. The power transistor 16 is responsive to the gate drive voltage 32 to begin conducting coil current $I_L$ through ignition coil L1. When the coil current $I_L$ reaches a pre-defined level, As shown by current level 38 of waveform 36, wherein the voltage across $R_{SENSE}$ is approximately equal to VREF, error amplifier 22 provides a corresponding signal to gate drive control circuit 20 to which circuit 20 is responsive to decrease gate drive voltage $V_{GD}$ to level 34 of waveform 30 to thereby limit $I_L$ to a predefined "hold" current level 38 or coil current limit level.

In practice, the resistor $R_{SENSE}$ is adjusted, or "trimmed", to cancel variations in the threshold voltage of power transistor 16 and other variations in control circuit 14 to thereby set the coil current limit to a specified level. If this trimming operation is not performed, manufacturing process related variations in power transistor 16, control circuit 14, and current sense resistor $R_{SENSE}$ can result in an excessively wide range of coil current limit levels within a given sample of power transistors 16 and control circuits 14.

In some applications of system 10, certain package and/or circuit configurations do not allow for trimming of the current sense resistor $R_{SENSE}$ after the control circuit 14 is mated with a randomly chosen power transistor 16. Variations internal to control circuit 14, however, can be adjusted, or "trimmed out", during testing and/or calibration of the control circuit 14. During such a trimming process, control circuit 14 is typically configured to produce a specific gate drive output voltage $V_{GD}$ which is selected to be approximately the average expected gate drive voltage required to achieve a desired coil current limit level for a particular type of power transistor 16. However, since randomly chosen power transistors 16 exhibit a distribution of voltages required to set conduction at a specific current level, the combination of "trimmed out" control circuits 14 with randomly chosen power transistors 16 will subject the completed systems 10 to variations in the coil current limit levels.

Typically, power transistor 16 is provided as an insulated gate bipolar transistor (IGBT) which has a gate voltage-to-collector current relationship, or "transconductance", that varies with temperature. Use of an IGBT for power transistor 16 thus introduces additional variations in the gate voltage required to "hold" the coil current $I_L$ at the desired coil current limit level.

Control circuit 14 typically includes feedback control loops having selectable gain that is capable of removing most of the effects of the foregoing variations in gate voltage $V_{GD}$. However, these variations further cause feedback currents in the feedback control loops to vary, thereby resulting in internal bias changes within control circuit 14 that cause $I_L$ to deviate from the desired coil current limit level.

Deviations in the coil current limit levels, as just described, are unacceptable and should be eliminated. As with any closed loop dynamic control system, however, too much gain in the feedback control loops of circuit 14 may result in circuit instability. It is therefore desirable to remove the bias effects internal to circuit 14 that are due to varying gate voltage levels $V_{GD}$ by a technique other than increasing the gain in the error amplifier gain loop.

SUMMARY OF THE INVENTION

The foregoing shortcomings of the prior art are addressed by the present invention. In accordance with one aspect of the present invention an amplifier circuit including compensation circuitry for canceling variations in an amplifier feedback signal comprises an amplifier circuit having an input, an output and a feedback path therebetween defining a feedback current therethrough, the feedback path introducing variations in the feedback current resulting from variations in an output signal defined at the amplifier output, and a compensation circuit having a current path connected to the amplifier input and defining a compensation current therethrough, the compensation current canceling the variations in the feedback current at the amplifier input.

In accordance with another aspect of the present invention, a method of canceling variations in a feedback current of an amplifier having an input, an output and a feedback path therebetween defining a feedback current therethrough, comprises the steps of replicating the feedback current through a first current path connected to the amplifier output coupling a second current path to the first current path to thereby establish the replicated feedback current therethrough connecting the second current path to the amplifier input to thereby draw the replicated feedback current from the amplifier input therethrough; and selecting amplifier component values to produce a desired output signal at the amplifier output with the second current path connected to the amplifier input, the replicated feedback current through the second current path thereafter canceling variations in the feedback current due to deviations in the amplifier output signal from the desired output signal.

One object of the present invention to provide an amplifier circuit for an automotive ignition system that includes compensation circuitry for canceling variations in an amplifier feedback signal to thereby cancel internal biasing effects due to variations in the amplifier output voltage.

Another object of the present invention is to provide such a system operable to drive an automotive ignition coil whereby a coil current limit level is not dependent upon the output voltage of the amplifier circuit.

A further object of the present invention is to provide such a system whereby changes in the amplifier output voltage resulting from temperature changes in a power transistor connected thereto will not result in variations in the coil current limit level.

These and other objects of the present invention will become more apparent from the following description of the preferred embodiment.

DESCRIPTION OF THE PREFERRED EMBODIMENT

Figure 1:
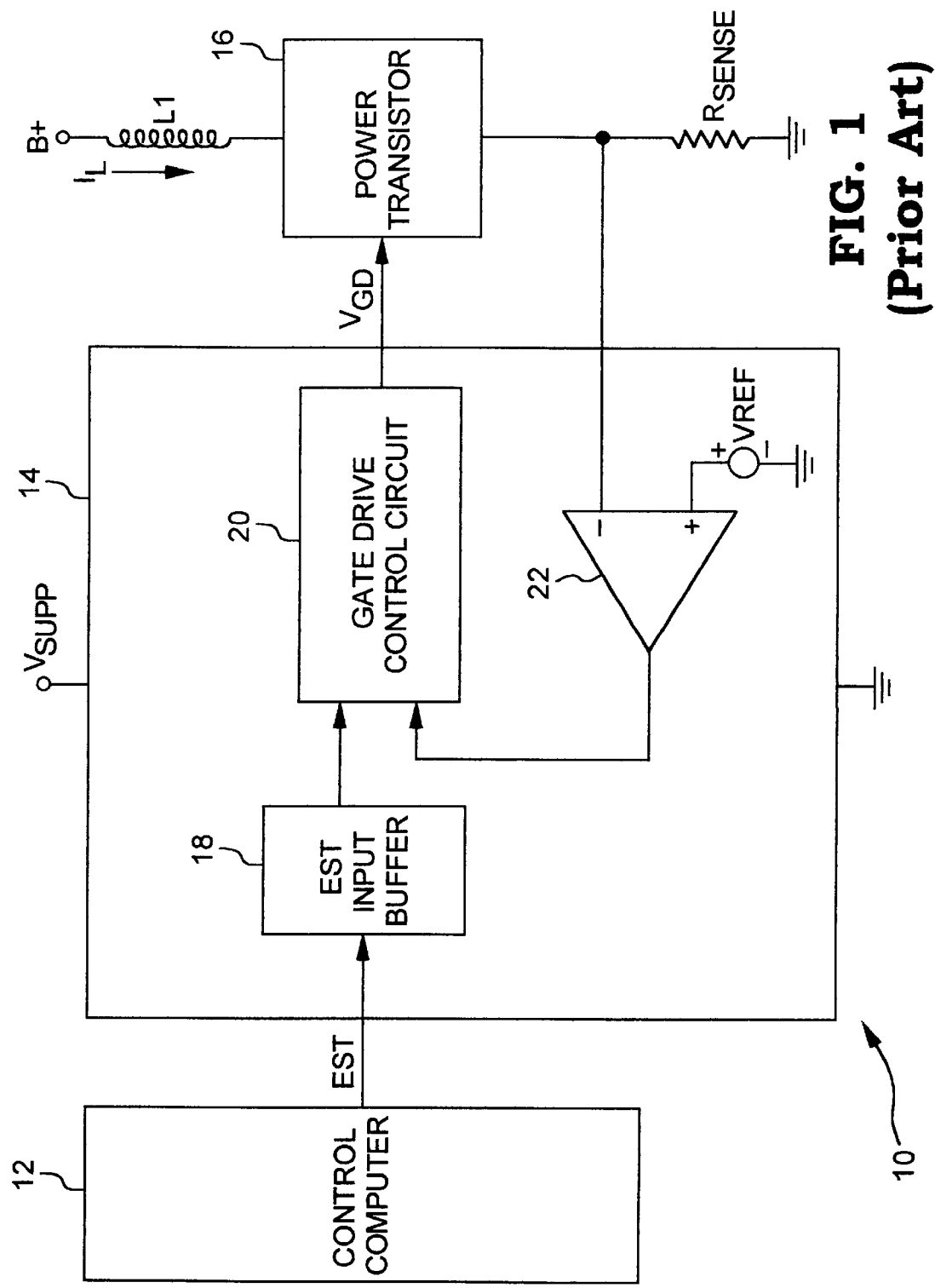
FIG. 1 is a diagrammatic illustration of a prior art system for controlling the operation of an automotive ignition coil.

For the purposes of promoting an understanding of the principles of the invention, references will now be made to the embodiment illustrated in the drawings and specific language will be used to describe the same. It will nevertheless be understood that no limitation of the scope of the invention is thereby intended, such alterations and further modifications in the illustrated device, and such further application of the principles of the invention as illustrated therein being contemplated as would normally occur to one skilled in the art to which the invention relates.

Figure 3:
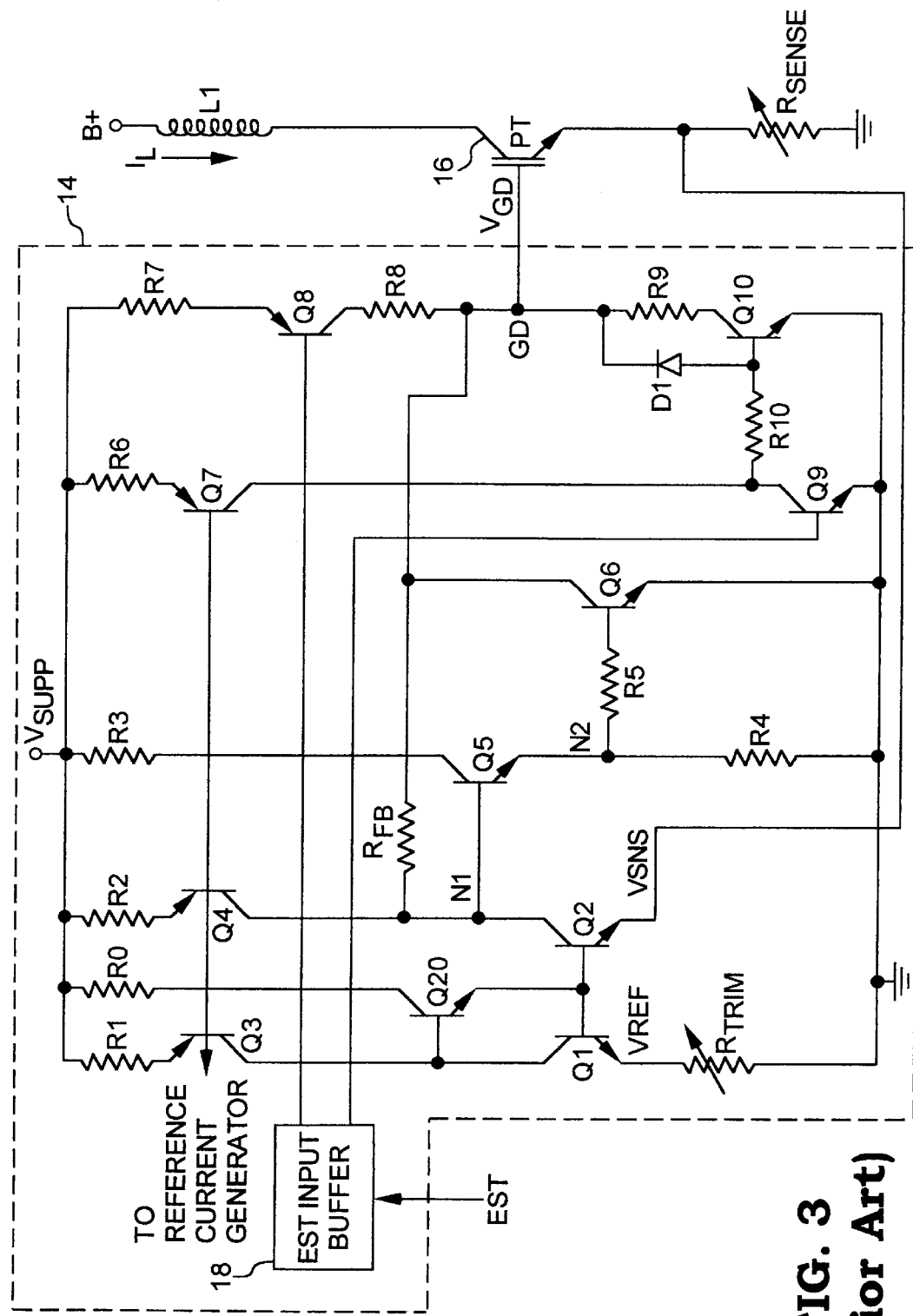
FIG. 3 is a schematic diagram illustrating a prior art implementation of the control circuit of FIG. 1.

Referring now to FIG. 3, a schematic diagram illustrating a prior art embodiment of the control circuit or amplifier circuit 14 of system 10 (FIG. 1) is shown. The structure and function of circuit 14 is essential to the understanding of the amplifier circuitry of the present invention, and will accordingly be described in detail.

Figure 2:
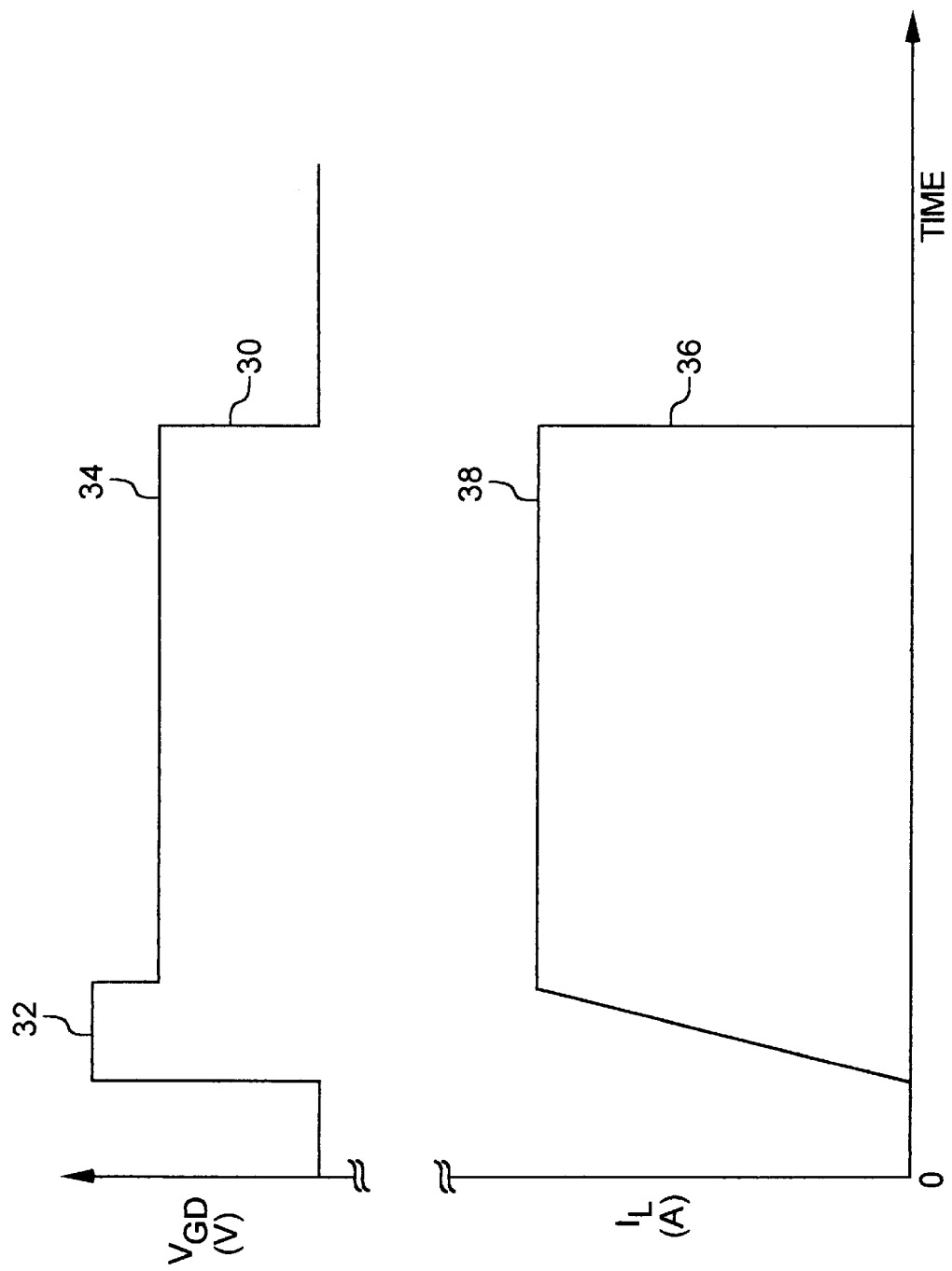
FIG. 2 is a plot illustrating waveforms of the gate drive voltage applied to the power transistor and of the coil current in the system of FIG. 1.

Referring now to FIG. 3, control circuit or amplifier circuit, 14 includes a first resistor R1 connected between a suitable supply voltage $V_{SUPP}$ and an emitter of a PNP transistor Q3. The base of Q3 is connected to a known reference current generator, and the collector of Q3 is connected to the base of a NPN transistor Q20 and the collector of a NPN transistor Q1. Another resistor R0 is connected between $V_{SUPP}$ and the collector of Q20. Yet another resistor R2 is connected between $V_{SUPP}$ and the emitter of a PNP transistor Q4, wherein the base of Q4 is connected to the base of Q3. The collector of Q4 is connected to one end of a feedback resistor $R_{FB}$, the base of an NPN transistor Q5 and the collector of a NPN transistor Q2, and defines a circuit node N1. The base of Q1 is connected to the emitter of Q20 and to the base of Q2. The emitter of Q1 is connected to one end of a resistor $R_{TRIM}$, the opposite end of which is connected to ground potential, and wherein a voltage reference VREF is established thereacross. The emitter of Q2 is directed out of circuit 14 and is connected between an emitter of power transistor 16, which is represented in FIG. 2 as an IGBT, and one end of sense resistor $R_{SENSE}$. The emitter of Q2 thus defines a voltage VSNS which is the voltage across $R_{SENSE}$.

Transistors Q1 and Q2 define a differential pair driven by current sources Q3 and Q4. As alluded to in the BACKGROUND section, circuit 14 is adjusted, or "trimmed out" prior to connection with transistor 16 and resistor $R_{SENSE}$. In the embodiment shown in FIG. 3, this adjustment is made by applying a voltage VSNS to the emitter of Q2 that represents a target coil current limit value in the operation of system 10. The value of $R_{TRIM}$ is then adjusted via known techniques to balance differential pair Q1 and Q2 as is known in the art. During subsequent operation of amplifier circuit 14, circuit 14 is operable to adjust the gate drive voltage $V_{GD}$ based on an amount of current flowing through feedback resistor RFB as will be described in greater detail hereinafter.

Circuit 14 further includes another resistor R3 connected between $V_{SUPP}$ and the collector of Q5, wherein the emitter of Q5 is connected to one end of a resister R5 and one end of a resister R4, and defines a second circuit node N2. The opposite end of R4 is connected to ground potential and the opposite end of R5 is connected to the base of an NPN transistor Q6. The emitter of Q6 is connected to ground potential and the collector of Q6 is connected to the opposite end of feedback resister $R_{FB}$ and defines a circuit node GD. Circuit node GD defines an output of amplifier circuit 14 and is connected to the gate of power transistor 16. Node GD defines the gate voltage $V_{GD}$ thereat.

Resistor R6 is connected between $V_{SUPP}$ and the emitter of a PNP transistor Q7. The base of Q7 is connected to the base of transistors Q3 and Q4, and the collector of Q7 is connected to one end of a resistor R10 and to the collector of a NPN transistor Q9. The base of Q9 is connected to the EST input buffer circuit 18, which is of known construction, and the emitter of Q9 is connected to ground potential. The opposite end of resistor R10 is connected to an anode of diode D1 and to the base of a NPN transistor Q10. The emitter of Q10 is connected to ground potential and the collector of Q10 is connected to one end of resistor R9. The opposite end of R9 is connected to the cathode of D1 and to circuit node GD and to one end of a resistor R8. The opposite of R8 is connected to the collector of a PNP transistor Q8. The base of Q8 is connected to the EST input buffer 18, and the emitter of Q8 is connected to one end of a resistor R7, the opposite end of which is connected to $V_{SUPP}$.

In the operation of amplifier circuit 14, EST input buffer 18 is responsive to the EST input signal provided by control computer 12 to drive the base of Q8 low and the base of Q9 high in order to drive gate voltage $V_{GD}$ to the voltage shown at 32 in FIG. 2 and which corresponds to the time period in which the coil current $I_L$ is ramping up to the coil current limit value. Diode D1 provides a clamp on output GD to thereby clamp the gate drive voltage $V_{GD}$ 32 to a desired value. As the coil current $I_L$ through $R_{SENSE}$ ramps up sufficiently to define a voltage VSNS thereacross that is approximately equal to VREF, transistors Q5 and Q6 are operable to decrease the gate drive voltage $V_{GD}$ to the voltage level 34 of FIG. 2 to thereby cause power transistor 16 to conduct only the limited coil current $I_L$ therethrough as shown at 38 in FIG. 2.

The differential pair Q1 and Q2 is connected in common base configuration with the signal applied at the emitter of Q2 modulating the collector current therethrough. As the voltage VSNS increases, less current from Q4 is consumed by Q2 and is therefore redirected as base current to Q5. This signal is amplified by both Q5 and Q6, ultimately resulting in current being drawn away from the gate drive output node GD and correspondingly decreasing the gate drive output voltage $V_{GD}$.

The gain loop between node GD and node N1 is modified by the resistor $R_{FB}$ and the voltage at node N1 is fixed by the combined base-emitter voltages of Q5 and Q6. Since the voltage at node N1 does not change for a given temperature, any increase in $V_{GD}$ translates to an increase in feedback current $I_{FB}$ through $R_{FB}$, wherein this change in current is described by the equation $\Delta I_{FB} = \Delta V_{GD}/R_{FB}$. The additional current $\Delta I_{FB}$ must be absorbed by transistor Q2, resulting in a higher current density in Q2 than was present with the lower gate voltage. This increase in current density, as compared to the current density in Q1, results in a higher base-emitter voltage (Vbe) for Q2. This Vbe difference appears as an offset voltage in the differential pair Q1 and Q2, which the closed loop defined by transistors Q5 and Q6 attempted to null out as described hereinabove. The amplifier circuit 14 accordingly decreases the gate voltage $V_{GD}$ slightly to compensate for this offset, thereby reducing the current limited value of coil current $I_L$ below its target value. Thus, with the circuitry 14 of FIG. 3, variations in gate voltage $V_{GD}$ result in internal offsets to amplifier circuit 14 which ultimately translate to deviations in the coil current limit value from its target value.

Figure 4:
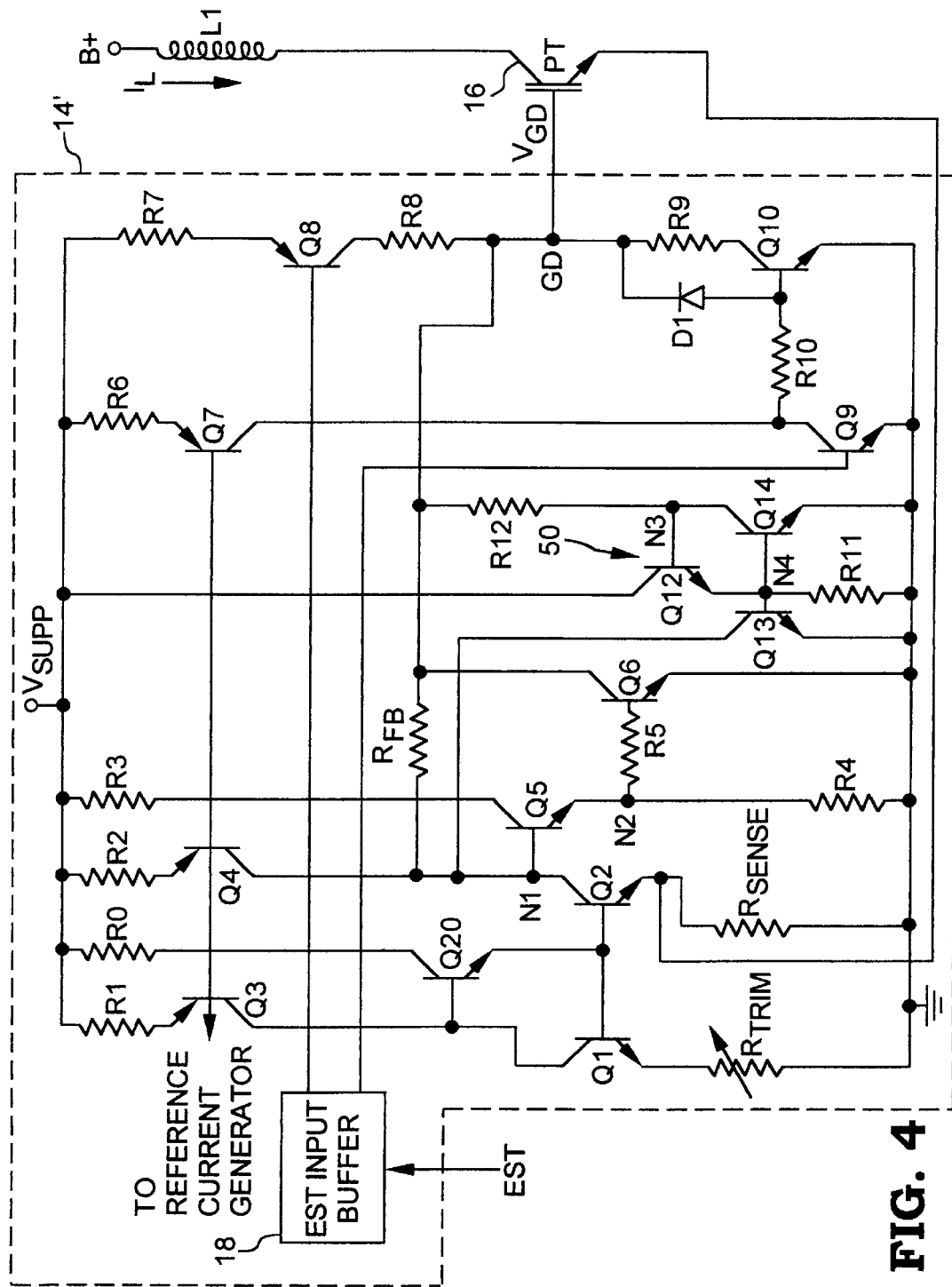
FIG. 4 is a schematic diagram illustrating one embodiment of an improved control circuit for use in the system of FIG. 1, in accordance with the present invention.

Referring now to FIG. 4, an improved control or amplifier circuit 14' is shown which eliminates the foregoing offset effects due to internal biasing of the amplifier circuit 14 illustrated in FIG. 3. Amplifier circuit 14' includes many of the circuit elements described in amplifier circuit 14, and their structure and function will therefore not be described again here for brevity's sake. One important difference in circuit 14' relative to circuit 14 of FIG. 3 is the location of $R_{SENSE}$. In the circuit 14 of FIG. 3, $R_{SENSE}$ is preferably a trimmable resistor located remote from circuit 14. Typically, $R_{SENSE}$ is provided as a thick film resistor that is trimmed via known means to thereby adjust the coil current limit value to its target value. In the circuit 14' of FIG. 4, however, $R_{SENSE}$ is located onboard circuit 14', wherein circuit 14' is preferably provided as a single integrated circuit fabricated in accordance with known techniques. Preferably, $R_{SENSE}$ in circuit 14' is not adjustable, but is rather set at a predetermined value. Fabrication tolerances of $R_{SENSE}$ and other circuit components are adjusted for, or "trimmed out" by adjusting $R_{TRIM}$ to thereby balance the differential pair Q1 and Q2 for a desired circuit output $V_{GD}$.

Because $R_{SENSE}$ in circuit 14' is no longer trimmable, circuit 14' includes no means other than the adjustment by circuit 14' of $V_{GD}$, as described above, for adjusting the coil current limit value to its desired value. While circuit 14' may be "trimmed out" as just described to thereby cancel the effects of any deviations in circuit component characteristics due to fabrication tolerances, a randomly chosen power transistor 16, such as an IGBT as shown in FIG. 4, may have a gate voltage requirement for maintaining the desired coil current limit value that is different than the target $V_{GD}$ level adjusted for during the trimming out of circuit 14'. Moreover, the bond wire and pin connections from $R_{SENSE}$ to the emitter of IGBT 16 will typically add resistance to $R_{SENSE}$, thereby causing further deviations in $V_{GD}$ from its target value adjusted for in the trimming out of circuit 14'. In the subsequent operation of circuit 14', as described hereinabove with respect to FIGS. 1 and 2, circuit 14' will accordingly be subject to the biasing effects due to offsets in $V_{GD}$ from its target value as described with respect to FIG. 3. Circuit 14' thus includes compensation circuiting 50 for canceling these biasing effects as will be described in greater detail hereinafter.

Compensation circuitry 50 includes a resistor R12 having one end connected to node GD, and an opposite end connected to the base of a NPN transistor Q12 and to the collector of an NPN transistor Q14. The collector of Q12 is connected to $V_{SUPP}$, and the emitter of Q12 is connected to the base of Q14, the base of a NPN transistor Q13 and to one end of a resistor R11. The opposite end of R11 is connected to ground potential as are the emitters of Q13 and Q14. The collector of Q13 is connected circuit node N1. The common connection of R12, the base of Q12 and the collector of Q14 define a circuit node N3, and the common connection of the emitter Q12, the bases of Q13 and Q14 and resistor R11 define a circuit node N4. With the exception of compensation circuitry 50 and the location of $R_{SENSE}$, circuit 14' is structurally and generally functionally identical to circuit 14 of FIG. 3.

The compensation circuitry 50 of amplifier circuit 14' removes the effects of variations in feedback current $I_{FB}$ on transistor Q2, as described hereinabove, in the following manner. When gate voltage $V_{GD}$ changes, the feedback current $I_{FB}$ through resistor $R_{FB}$ changes as described above with respect to circuit 14 of FIG. 3. A replica of the current $I_{FB}$ is created in resistor R12 of compensation circuitry 50 since one end of R12 is connected to circuit node GD, and circuit node N3 is designed to be at the same potential as circuit node N1. Resistor R11 is chosen to be the same value as resistor R4, thereby establishing a current through transistor Q12 that is identical to the current through transistor Q5. The base-emitter voltage of transistor Q12 is therefore identical to that of transistor Q5, and with the additional Vbe drop of transistor Q14, the voltage difference between node GD and node N3 is accordingly the same as the voltage difference between node GD and node N1.

Resistor R12 is preferably chosen to be same as that of resistor $R_{FB}$, such that a current identical $I_{FB}$ is defined through R12. The current through R12 is replicated through transistors Q14 and Q13, which are connected in a standard current mirror configuration, and is thus removed from circuit node N1. If the remaining circuit components (e.g. $R_{TRIM}$, $R_{FB}$, $R_{SENSE}$, etc.) are chosen such that differential pair Q1 and Q2 can be balanced as described hereinabove with the inclusion of compensation circuitry 50, any change in feedback current $\Delta I_{FB}$ introduced at node N1 via feedback resistor $R_{FB}$ is removed by compensation circuitry 50 as just described. As a result, any small changes in gate drive voltage $V_{GD}$ will not cause a corresponding change in the bias current of Q2 described above. Without any such bias changes, amplifier circuit 14' can adjust the gate voltage $V_{GD}$ to control the coil current $I_L$, as described above, without introducing any offsets necessary to compensate for the bias differences. Thus, since no offset is produced in the amplifier circuit 14' by changes in the gate voltage $V_{GD}$, the coil current limit level is not dependent on gate voltage $V_{GD}$ during "hold" mode operation as described above. Accordingly, a power transistor 16, such as an IGBT, with a gate voltage requirement different than the target voltage $V_{GD}$ used during the trimming process of circuit 14' will not induce any variations in the coil current limit level $I_L$. Additionally, any changes in gate voltage $V_{GD}$ resulting from temperature changes in the IGBT will not cause variations in the coil current limit level $I_L$.

While the invention has been illustrated and described in detail in the foregoing drawings and description, the same is to be considered as illustrative and not restrictive in character, it being understood that only the preferred embodiment has been shown and described and that all changes and modifications that come within the spirit of the invention are desired to be protected.

What is claimed is:

1. An amplifier circuit including compensation circuitry for canceling variations in an amplifier feedback signal, comprising:

a driver circuit responsive to a control signal at an input thereof to drive an output thereof to a first signal level;

an error amplifier responsive to a predefined sense signal level to adjust said output of said driver circuit from said first signal level to a second lower signal level;

a feedback path established between said output of said driver circuit and a circuit node of said error amplifier, said feedback path introducing current variations in said error amplifier resulting from variations in said second signal level; and a compensation circuit having a current path connected to said circuit node of said error amplifier and defining a compensation current therethrough, said compensation current canceling said current variations in said error amplifier introduced by said feedback path.

2. The amplifier circuit of claim 1 further including:

a power transistor having a gate input connected to said output of said driver circuit; and an inductive load connected to said power transistor, said power transistor configured to drive said inductive load according to said first and second signal levels defined at said output of said driver circuit.

3. The amplifier circuit of claim 2 wherein said inductive load is an ignition coil of an internal combustion engine.

4. The amplifier circuit of claim 2 further including a control computer coupled to said amplifier circuit and controlling a switching state of said control signal.

5. The amplifier circuit of claim 1 wherein said compensation circuit includes:

a first circuit path connected to said output of said driver circuit and defining said compensation current therethrough substantially equal to said feedback current; and a second circuit path coupled to said first circuit path to thereby replicate said compensation current therethrough, said second circuit path defining said current path.

6. In an amplifier circuit having a driver input, a driver output, an error amplifier and a feedback path established between said driver output and the error amplifier and defining a feedback current therethrough, a method of canceling variations in the feedback current, comprising the steps of:

replicating the feedback current through a first current path connected to the driver output;

coupling a second current path to the first current path to thereby establish the replicated feedback current therethrough;

connecting the second current path to the error amplifier to thereby draw the replicated feedback current from the error amplifier therethrough; and selecting amplifier circuit component values to produce a desired output signal at the driver output with the second current path connected to the error amplifier, the replicated feedback current through the second current path thereafter canceling variations in the feedback current due to deviations in an output signal at the driver output from the desired output signal.

7. The method of claim 6 further including the step of connecting the driver output to a gate input of a power transistor.

8. The method of claim 7 further including the step of connecting an ignition coil of an internal combustion engine to the power transistor.

9. The method of claim 8 further including the steps of:

connecting a control computer to the driver input; and controlling switching operation of the driver output via the control computer to thereby cause the power transistor to operatively drive the ignition coil.

* * * * *